United States Patent [19]

Moulton et al.

[11] 4,222,009
[45] Sep. 9, 1980

[54] PHASE LOCK LOOP PRECONDITIONING CIRCUIT

[75] Inventors: Robert K. Moulton, North Wales; John W. Thompson, Willow Grove, both of Pa.

[73] Assignee: Sperry Corporation, New York, N.Y.

[21] Appl. No.: 957,256

[22] Filed: Nov. 2, 1978

[51] Int. Cl.² .................... H03K 1/17; H03K 5/156
[52] U.S. Cl. .................................. 328/72; 307/208; 307/269; 375/110; 375/120
[58] Field of Search ............... 307/208, 269; 328/72, 328/63; 178/69.1

[56] References Cited

U.S. PATENT DOCUMENTS

| | | | |
|---|---|---|---|
| 3,582,795 | 6/1971 | Heick | 328/63 |
| 3,654,492 | 4/1972 | Clark | 307/269 |
| 3,755,748 | 8/1973 | Carlow et al. | 328/72 X |
| 3,894,246 | 7/1975 | Turgrim | 307/208 |
| 4,039,960 | 8/1977 | Clark | 307/208 X |
| 4,080,576 | 3/1978 | Huber et al. | 328/72 X |

Primary Examiner—John S. Heyman

[57] ABSTRACT

A preconditioning circuit is inserted in series between a coded stream of data pulses and a standard commercially available phase lock loop of the type having a nonharmonic phase detector. The novel preconditioning circuit converts the input coded stream of data pulses which do not have a transition during each cell time into a stream of pulses having a transition during each data cell time to enable the nonharmonic phase lock loop to synchronize with the data cell time and to produce clock pulses synchronized with the data cell time.

16 Claims, 6 Drawing Figures

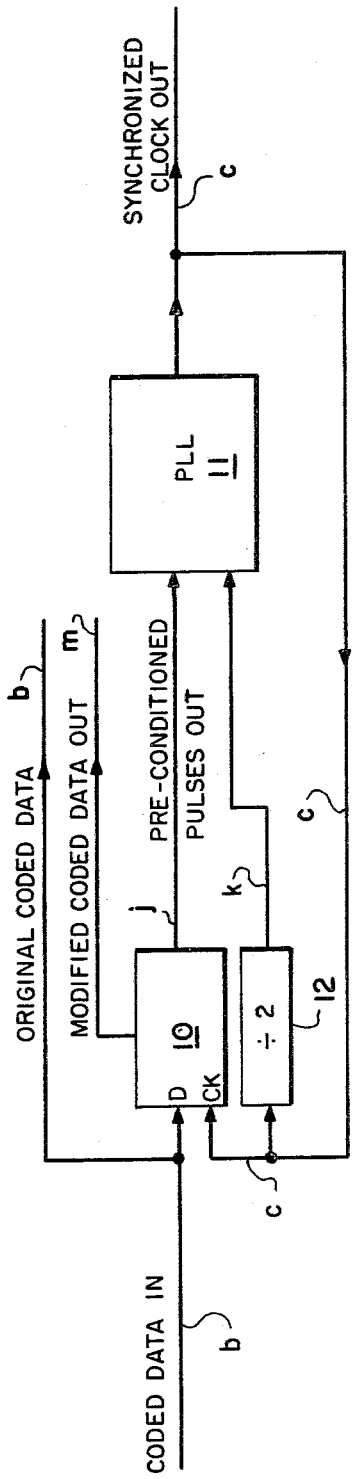
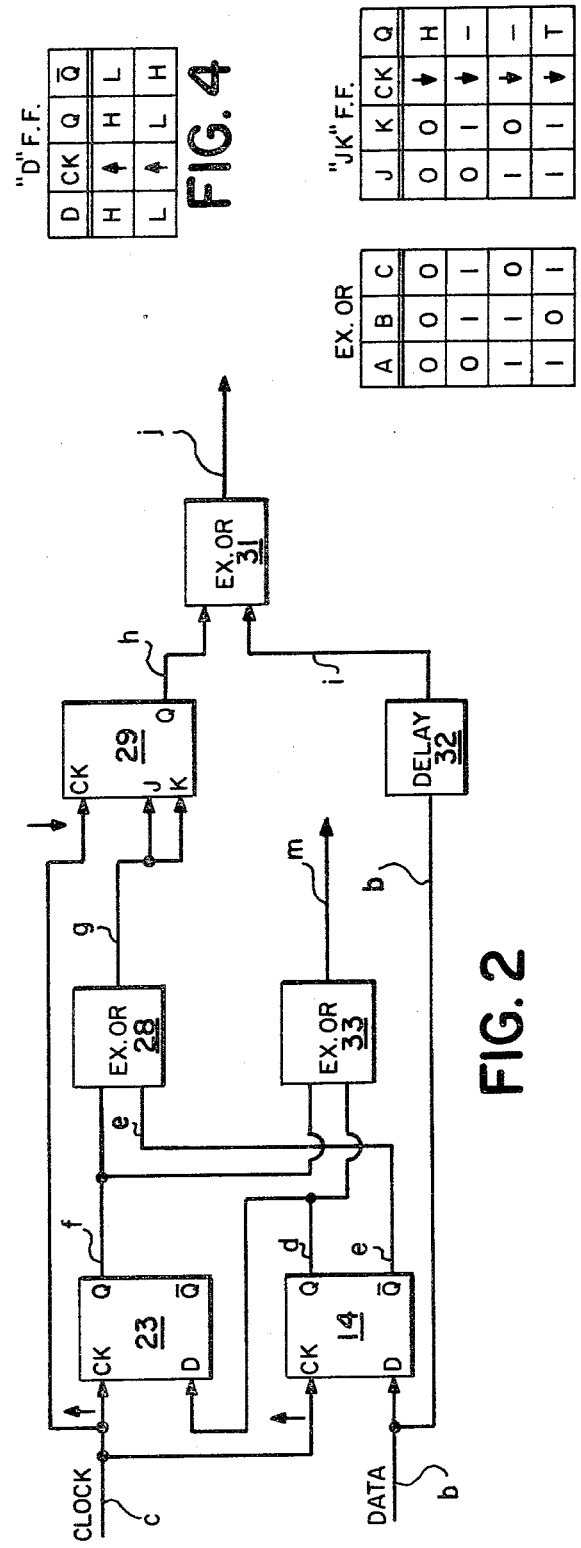

PHASE LOCK LOOP PRECONDITIONING CIRCUIT

BACKGROUND OF THE INVENTION

1. Field of the Invention

The present invention relates to phase lock loop circuits and more particularly to preconditioning circuits which enable cheap commercially available phase lock loop circuits to be used with a coded stream of data pulses which do not have a pulse transition during every data cell time.

2. Description of the Prior Art

Heretofore, preconditioning logic circuits and compensating logic circuits have been employed to convert coded data pulses into a usable stream of data pulses before applying them to the input of a phase lock loop circuit. The preconditioning circuit enables the phase lock loop to lock on to the frequency of the data cells of the coded data. Such preconditioning logic circuits have been classified in class 307, subclasses 208 etc.

Preconditioning logic circuits are generally employed when the phase lock loop to be used includes a nonharmonic phase detector and the coded data input stream consists of high density coded data being read from a disk memory or other serial interface. The speed of a disk memory is subject to small variations in frequency such that a fixed frequency oscillator cannot be used to stay synchronized with the stream of coded data pulses. A phase lock loop of the type having a phase detector and a voltage controlled oscillator has been used to track and follow the input stream of coded data pulses so as to synchronize on the stream of data pulses. Heretofore, phase lock loop employing nonharmonic phase detectors would not sychronize with or lock onto a stream of data pulses which did not have data transitions occurring in a predeterminable regular pattern.

There is a problem in synchronizing on the stream of coded data pulses when the input data stream of coded pulses comprises non-repetitive coded data pulses. Such irregular pulses when applied with repetitive an regular clock pulses to a nonharmonic phase detector produces a voltage output which is not representative of the frequency of the data cells. The phase detector generates an out-of-sync signal which causes the voltage controlled oscillator and the phase lock loop to generate pulses out of synchronism with the frequency of the data cells.

High density data codes such as PM, 3PM, MFM, M²FM as well as Cohn-Lempel codes, generically known as M for N rate NRZI run bounded codes, are non-repetitive and may have consecutive data cell times in which no transitions occur.

On prior art solution to the problem of driving a phase lock loop with irregular pulses is to employ a logic circuit which senses whether the data pulses are occurring at regular data cell intervals. If the data pulses are regular, they are then fed to a nonharmonic phase detector in a phase lock loop. However, when the logic senses that the coded data pulses are irregular, the circuit logic switches over to a harmonic phase detector for generating pulses approximating the data cell frequency.

Other prior art logic circuits have been suggested in which the phase detector of the phase lock loop is first supplied with a regular series of data pulses having the desired data rate frequency. The voltage level at the input of the phase detector which is representative of the desired data rate is measured and duplicated by a matching circuit. Further logic circuitry senses the absence of repetitive data pulses and the matching voltage is substituted at the input of the phase detector so as to present an output which drives the voltage controlled oscillator of the phase lock loop at a desired predetermined frequency.

U.S. Pat. No. 3,950,658 shows and teaches a compensation circuit which will generate an output clock pulse synchronized with an input data stream of MFM coded data. This reference employs a charge pump which includes a pair of capacitors. The charge on the two capacitors are employed to generate a correction voltage representative of a difference between the data time frequency and the clock time frequency. This reference also explains that prior art attempts to generate clock pulses from a modified frequency modulation (MFM) raw data signal introduced errors in the voltage controlled oscillator when a data pulse was either early or late. It is known that delay circuits and logic gating circuits which compare the length of data pulses with clock pulses and/or compare the leading or trailing edges of data pulses with clock pulses will generate error signals when the data pulse is distorted or arrives either early or late.

SUMMARY OF THE INVENTION

It is an object of the present invention to provide a novel and improved preconditioning logic circuit for M for N rate NRZI run bounded codes.

It is a further object of the present invention to provide a digital preconditioning logic circuit capable of operating at data rate frequency up to 100 megacycles.

It is a further object of the present invention to provide a preconditioning logic circuit for a phase lock loop of the type which can be implemented in the form of a single integrated circuit chip.

It is a primary object of the present invention to convert a coded input data stream which does not have transitions in each data cell into a stream of pulses having a transition in each data cell and which is synchronized with the output of a nonharmonic phase lock loop.

It is yet another object of the present invention to provide a novel, cheap and reliable high speed preconditioning circuit for converting NRZI coded data into NRZ coded data and for providing a clock synchronized with both streams of coded data.

According to this and other objects of the present invention, there is provided a novel circuit for preconditioning a train of irregular coded pulses which do not have a data transition in each data cell into a train of regular pulses having a transition in each data cell. The logic circuitry for preconditioning the train of coded data pulses comprises only two logic gates and a plurality of bi-stable devices.

BRIEF DESCRIPTION OF THE DRAWINGS

FIG. 1 is a schematic block diagram showing the present invention preconditioning circuit in the environment of a prior art phase lock loop;

FIG. 2 is a schematic block diagram of the circuit logic of the present invention;

FIG. 4 is a truth table for a D-type flip-flop employed in the preferred embodiment of FIG. 2;

FIG. 5 is a truth table for an exclusive OR gate of the type employed in the preferred embodiment of FIG. 2; and FIG. 6 is a truth table for a J-K type flip-flop of the type employed in the preferred embodiment of FIG. 2.

DESCRIPTION OF THE PREFERRED EMBODIMENT

Figure 3:
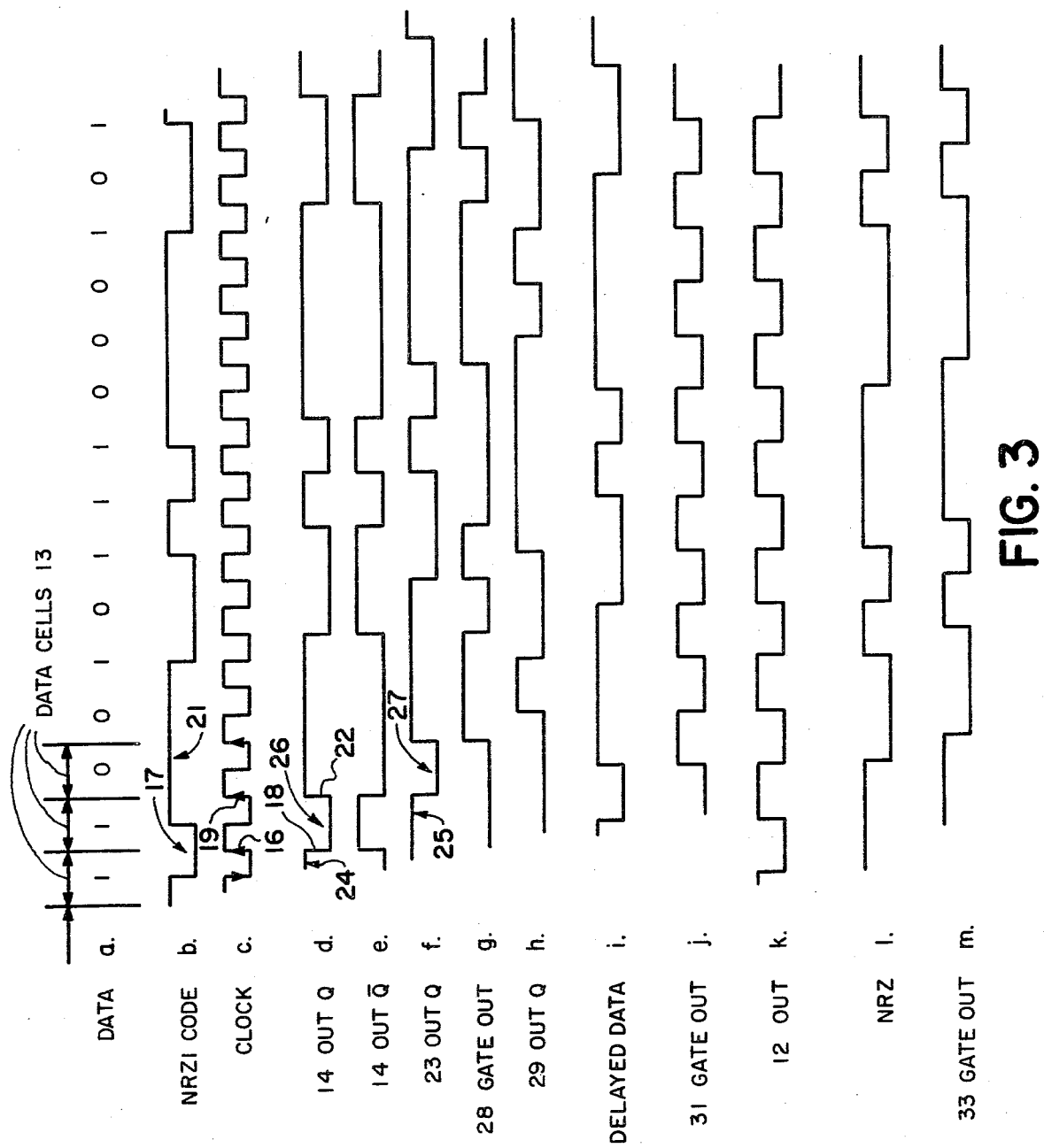
FIG. 3 is a schematic drawing of the pulses and waveforms which occur in FIG. 2.

Refer now to FIG. 1 showing a schematic block diagram having a novel preconditioning circuit 10. The preconditioning circuit 10 has a stream of coded data pulses applied at the input on line b and have a stream of clock pulses applied via line c. The output of the preconditioning circuit 10 is applied to a commercially available nonharmonic phase lock loop circuit 11 which is also supplied with every other pulse of the train of clock pulses via line k to provide the synchronized clock pulse output which occurs at line c. The divide by two logic 12 may be any well-known commercially available device such as a bi-stable device.

Refer now to FIGS. 2 and 3 showing the novel preconditioning circuit and the pulse and waveforms which are associated with FIG. 2. For purposes of this explanation the stream of coded data pulses at the input have been assumed to be 110010111000101 as shown at FIG. 3a. The binary data digits are shown in the center of the data cells 13. Further, for purposes of explanation the data stream of FIG. 3a is shown as a pulse stream in FIG. 3b in NRZI coded format. It will be noted that a positive or negative transition occurs at the center of the data cell when and only when the binary digit 1 occurs within the data cell. Accordingly, it will be observed that a space or pulse three data cells wide occurs as the result of the first two consecutive 0s. Similarly a pulse two data cells wide occurs at the occurrence of 0 data and a data pulse four data cells wide occurs at the first occurrence of three 0s in the data chain. High density codes classified as Cohn-Lempel codes, generically known as M for N rate NRZI run bounded codes are non-repetitive and normally have 40 consecutive data cell times in which no transition occurs. In the case of the NRZI code shown in FIG. 3b no transition occurs in a data cell as the result of a 0 data bit.

Disk file memories which incorporate high density codes to achieve the maximum concentration of data in the smallest possible area require a pulse train of clock pulses synchronized with the data being read from the memory disk in order to make the data useful. It is impractical to attempt to place a train of clock pulses on the memory disk as was done in the prior art with drum memory systems employing low density data codes. It is desirable that the coded data being read from the memory disk be employed to either generate the train of clock pulses or to synchronize an oscillator which generates the clock pulses.

A pulse train of clock pulses of the type desired for synchronizing the coded data in waveform FIG. 3b is shown in waveform FIG. 3c. The complete cycle of the clock pulse provides a positive going transition shown by the arrow pointing up and a negative transition shown by the arrow pointing down on the waveform FIG. 3c.

The NRZI coded data at waveform FIG. 3b is applied at line b to the D input of flip-flop 14. The clock input FIG. 3c is applied to the clock input of flip-flop 14 via line c. The arrow at the clock input indicates that the Q output of the D-type flip-flop will assume the state of the data D when the positive edge of the clock arrives at the clock input. The Q output will hold the state so assumed until the D input or a reset input changes the state of the flip-flop 14. The truth table FIG. 4 shows the output Q to be high when the clock arrives high with the data high. The $\overline{Q}$ output is always exactly opposite the Q output. FIGS. 3d and 3e show the output at Q and $\overline{Q}$ respectively on lines d and e of FIG. 2. The positive transition pulse 16 of FIG. 3c senses the presence of negative pulse 17 at the data input of flip-flop 14 and generates the negative transition 18 at the output Q of flip-flop 14 on line d. Similarly the positive clock transition 19 senses the presence of positive pulse 21 at input D and generates transition 22 at the Q output of flip-flop 14 on line d. It will be noted that FIG. 3d is a waveform identical to FIG. 3b but has been delayed one-half of one cell time. FIG. 3e is an inverted image waveform of FIG. 3d.

The Q output from flip-flop 14 on line d as shown in FIG. 3d is connected to the data or D input of flip-flop 23 and the clock input of FIG. 3c is connected to the clock input of flip-flop 23. The arrow at the clock input indicates that the positive transition of the clock pulse causes the Q output to assume the state of the data "D" input when the positive edge of the clock arrives at the clock input. The first positive transition 16 of the clock FIG. 3c senses the presents of positive pulse 24 on line d and generates the positive pulse 25 shown in FIG. 3f. When the next positive transition clock 19 arrives, the negative pulse 26 is present on line d at the data input D of flip-flop 23 and generates the negative pulse 27 on line f at the Q output of flip-flop 23. Comparing FIGS. 3d and 3f, it will be noted that waveform FIG. 3f is delayed one data cell time more than the identical waveform FIG. 3d from which it was derived.

The waveform FIGS. 3e and 3f are applied to the input of exclusive OR gate 28 to generate the output waveform FIG. 3g. The truth table for the exclusive OR gate 28 is shown in FIG. 5. The output C of an exclusive OR gate is high when and only when one of the A or B inputs is high. The output waveform of exclusive OR gate 28 is applied via line g to the J and K inputs of the J-K flip-flop 29. A clock input on line c is applied to the clock input of flip-flop 29 and the arrow shows that the negative transition of the clock input strobes the data input lines J and K to determine the next state of the flip-flop. A truth table for a J-K flip-flop is shown in FIG. 6 wherein both of the J and K inputs are 0 the state of the flip-flop remains unchanged or holds condition H. When the J and K inputs are both 1 when the negative transition of the clock pulse arrives, the flip-flop toggles (T) or changes state. Since the J and K terminal inputs are tied together, they must always be 00 or 11. The Q output of the J-K flip-flop 29 is shown as waveform FIG. 3h and is applied to the input of exclusive OR gate 31 along with a stream of coded data pulses as shown in FIG. 3b which have been delayed in delay 32 to provide the delayed NRZI data pulses as shown in FIG. 3i. The delay 32 may be a fixed delay line since its purpose is to create a phase shift of only one data cell time. When the preferred embodiment preconditioning circuit is placed on a single integrated circuit chip, an edge triggered flip-flop of the type employed for flip-flops 14 and 23 may be substituted therefore. Further, it may be desirable in some forms of the present invention to substitute an LRC network for the delay 32 in order to achieve proper data cell delays.

The input waveforms FIG. 3h and 3i apply to exclusive OR gate 31 produce the gated output FIG. 3j which is shown to be a pulse train having a transition at the center of each data cell. The output waveform FIG. 3j is shown in FIG. 1 to be the pre-conditioned pulses 5 which are applied to the phase lock loop 11 to produce the pulse train FIG. 3c. Since the pulse train FIG. 3c has twice as many transitions as the pulse train FIG. 3j, the pulse train FIG. 3c is divided by two at the divider 12 to produce the waveforms shown as FIG. 3k. When the waveform FIGS. 3j and 3k are applied to the phase lock loop 11, they are capable of driving a nonharmonic phase detector and producing an output which will cause the oscillator of the phase lock loop (not shown) to sync or lock on to the coded data input being applied to the preconditioning circuit 10 via line b.

FIG. 3l shows a pulse train of data coded in NRZ code representative of the data shown in FIG. 3a. The NRZ code shown in FIG. 3l may be produced by applying waveforms FIG. 3d and 3e to an exclusive OR gate 33 to produce the NRZ coded data out as shown in FIG. 3m. It will be noted that the NRZ coded data out of exclusive OR gate 33 on line m is delayed one-half of one cell time as shown by the comparison with FIG. 3l.

Having explained the invention with reference to a coded stream of NRZI data pulses having no transitions in one to four or more data cells it will be understood that other M for N rate NRZI run bounded codes will be converted or preconditioned so as to produce a regular pulse train such as that shown in FIG. 3j which can be applied to a nonharmonic phase detector to produce a clock pulse which is locked on to the irregular data.

In the preferred embodiment shown, the phase lock loop is commercially available as a Signetics 562b chip or may be made from a 4044 Motorola phase detector and a 74S124 TI voltage controlled oscillator. Preferably the J-K flip-flops are 74S112 and the D flip-flops are 74S74 dual edge triggered type flip-flops. The exclusive ORs may be two input quad exclusive ORs designated as 74S86 types.

Having explained the preferred embodiment of the present invention, it will be understood that the same mode of operation may be implemented by employing other bi-stable devices in the same basic mode of operation. For example flip-flop 14, 23 and 29 need not be flip-flops or edge triggered flip-flop or triggered by the positive edge of the clock transition. Bi-stable devices which delay the data pulse trains applied to their inputs are preferred because their outputs assume the desired state almost instantaneously after being strobed by a clock pulse. The same result may be obtained when the D-type flip-flops 14, 23 are triggered by negative clock transitons if the J-K type flip-flop 29 is triggered by positive clock transitions.

We claim:

1. A circuit for preconditioning a coded stream of data pulses which may or may not have a transition occurring during each cell time so the pulses may be applied to a conventional phase lock loop to enable it to lock on to the data cell frequency and to produce clock pulses synchronized with the data cell time, comprising:
a source of clock pulses for synchronizing bi-stable devices,
a source of data pulses,
a first bi-stable device connected to said data pulses for providing delayed data pulses and inverted data pulses which are delayed one-half cell time,
a second bi-stable device connected to said delayed data pulses for providing double delayed data pulses which are further delayed one cell time,
first gating means connected to said delayed inverted data pulses and to said double delayed data pulses for producing an output when and only when a single data pulse is present at the input,
a third bi-stable device connected to the output of said first gating means for producing formed data pulses which change when the input to said third bi-stable device is high,
second gating means connected to the output of said third bi-stable device and to the source of data pulses delayed at least one data cell time for producing said preconditioned data pulses to be applied to said phase lock loop.

2. A circuit as set forth in claim 1 wherein the output of said second gating means is connected to said phase lock loop for providing said source of clock pulses for synchronizing said bi-stable devices at the output of said phase lock loop.

3. A circuit as set forth in claim 2 which further includes means for dividing said clock pulses by two, said means for dividing said clock pulses by two being connected to an input of said phase lock loop.

4. A circuit as set forth in claim 1 wherein said first and said second bi-stable devices comprise flip-flops.

5. A circuit as set forth in claim 4 wherein said flip-flops comprise D-type flip-flops.

6. A circuit as set forth in claim 1 wherein said third bi-stable device comprises a flip-flop.

7. A circuit as set forth in claim 6 wherein said flip-flop comprises a JK-type flip-flop.

8. A circuit as set forth in claim 1 wherein said second gating means comprises an exclusive OR gate.

9. A circuit as set forth in claim 8 wherein said first gating means further comprises an exclusive OR gate.

10. A circuit as set forth in claim 1 which further includes delay means for delaying the data input one data cell time before being applied to said second gating means.

11. A circuit as set forth in claim 10 wherein said delay means for delaying said data input comprises a flip-flop.

12. A circuit as set forth in claim 11 wherein said flip-flop comprises a D-type flip-flop.

13. A circuit as set forth in claim 1 wherein said source of data pulses comprises a NRZI stream of coded data and further includes an exclusive OR circuit having its two inputs connected to said first and said second bi-stable devices and wherein the output of said exclusive OR circuit comprises a NRZ coded data stream output.

14. A circuit for preconditioning a coded stream of data pulses which may be or may not have a transition occurring during each cell time which are to be applied to a phase lock loop to provide data pulses to enable a conventional phase lock loop to lock on to the data cell frequency and to produce clock pulses synchronized with the cell time, comprising:
a first clocked bi-stable device connected to said data pulses for providing delayed data pulses and inverted data pulses which are delayed one-half cell time,
a second clocked bi-stable device connected to said delayed data pulses for providing double delayed data pulses and double delayed inverted formed data pulses which are further delayed one cell time, first gating means connected to said delayed inverted data pulses and to said double data pulses for producing an output when and only when a single data pulse is present at the input, a third clocked bi-stable device connected to the output of said first gating means for producing formed data pulses which change when the output of the first gating means is high, second gating means connected to the output of said third bi-stable device and to said data pulses delayed at least one data cell time for producing said preconditioned data pulses to be applied to said phase lock loop.

15. A circuit as set forth in claim 14 wherein said third bi-stable device comprises a J-K flip-flop.

16. A circuit as set forth in claim 15 wherein said J-K flip-flop is clocked by the negative transitions of said clock pulses, and said second gating means are delayed one data cell time.

* * * * *